(12) United States Patent
Carcasi et al.

(10) Patent No.: US 11,703,459 B2
(45) Date of Patent: Jul. 18, 2023

(54) SYSTEM AND METHOD TO CALIBRATE A PLURALITY OF WAFER INSPECTION SYSTEM (WIS) MODULES

(71) Applicant: Tokyo Electron Limited, Tokyo (JP)

(72) Inventors: Michael Carcasi, Austin, TX (US); Hiroyuki Iwaki, Tokyo (JP); Toyohisa Tsuruda, Kumamoto (JP); Masahide Tadokoro, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 403 days.

(21) Appl. No.: 17/037,007

(22) Filed: Sep. 29, 2020

(65) Prior Publication Data

US 2021/0131977 A1 May 6, 2021

Related U.S. Application Data

(60) Provisional application No. 62/930,089, filed on Nov. 4, 2019.

(51) Int. Cl.
*G01N 21/95* (2006.01)
*H01L 21/66* (2006.01)
(Continued)

(52) U.S. Cl.
CPC ......... *G01N 21/9501* (2013.01); *H01L 22/12* (2013.01); *H01L 22/24* (2013.01);
(Continued)

(58) Field of Classification Search
CPC .. G01N 21/9501; G01N 21/274; G01N 21/93; G01N 21/3563; G01N 2021/1776;
(Continued)

(56) References Cited

U.S. PATENT DOCUMENTS 6,570,650 B1 * 5/2003 Guan .................. G01J 3/46
356/237.4
6,686,602 B2 2/2004 Some
(Continued)

FOREIGN PATENT DOCUMENTS

WO 0229390 W 4/2002

OTHER PUBLICATIONS

U.S. Appl. No. 17/341,105, filed Jun. 7, 2021.
(Continued)

*Primary Examiner* — Sang H Nguyen
(74) *Attorney, Agent, or Firm* — Slater Matsil, LLP

(57) ABSTRACT

Various embodiments of systems and methods for calibrating wafer inspection system modules are disclosed herein. More specifically, the present disclosure provides various embodiments of systems and methods to calibrate the multiple spectral band values obtained from a substrate by a camera system included within a WIS module. In one embodiment, multiple spectral band values are red, green, and blue (RGB) values. As described in more detail below, the calibration methods disclosed herein may use a test wafer having a predetermined pattern of thickness changes or color changes to generate multiple spectral band offset values. The multiple spectral band offset values can be applied to the multiple spectral band values obtained from the substrate to generate calibrated RGB values, which compensate for spectral responsivity differences between camera systems included within a plurality of WIS modules.

23 Claims, 9 Drawing Sheets

(51) Int. Cl.
   *G01N 21/17* (2006.01)
   *G01N 21/3563* (2014.01)
(52) U.S. Cl.
   CPC . *G01N 21/3563* (2013.01); *G01N 2021/1776* (2013.01); *G01N 2021/3568* (2013.01)
(58) Field of Classification Search
   CPC ...... G01N 2021/3568; G01N 2021/933; H01L 22/24; H01L 22/12
   See application file for complete search history.

(56) References Cited

U.S. PATENT DOCUMENTS

| | | | |
|---|---|---|---|
| 6,693,708 B1 | 2/2004 | Hunter | |
| 6,707,545 B1 | 3/2004 | Hunter | |
| 6,710,868 B2* | 3/2004 | Guetta | G01N 21/94 250/559.48 |
| 6,721,045 B1 | 4/2004 | Hunter | |
| 6,847,443 B1* | 1/2005 | Herod | G01N 21/956 250/559.27 |
| 6,879,390 B1* | 4/2005 | Kvamme | G01N 21/956 356/237.5 |
| 7,012,684 B1 | 3/2006 | Hunter | |
| 7,659,973 B2 | 2/2010 | Furman | |
| 9,709,510 B2 | 7/2017 | Kolchin | |
| 2005/0041850 A1* | 2/2005 | Watkins | G06T 5/006 382/145 |
| 2005/0052530 A1* | 3/2005 | Simpkins | G01N 21/8806 348/131 |
| 2006/0262295 A1 | 11/2006 | Backhauss | |
| 2008/0117411 A1* | 5/2008 | Vuong | G01N 21/956 356/73 |
| 2008/0144025 A1 | 6/2008 | Vollrath | |
| 2010/0091284 A1 | 4/2010 | Mieher et al. | |
| 2010/0177326 A1* | 7/2010 | Sakai | G01B 11/0625 356/632 |
| 2013/0010296 A1 | 1/2013 | Kwak et al. | |
| 2013/0132021 A1* | 5/2013 | Kwak | G03F 7/70608 356/402 |
| 2015/0029517 A1 | 1/2015 | Park et al. | |
| 2015/0346609 A1 | 12/2015 | Den Boef | |
| 2015/0362367 A1 | 12/2015 | Seo et al. | |
| 2020/0234428 A1 | 7/2020 | George | |

OTHER PUBLICATIONS

U.S. Appl. No. 17/037,131, filed Sep. 29, 2020.
U.S. Appl. No. 17/037,142, filed Sep. 29, 2020.
U.S. Appl. No. 17/349,538, filed Jun. 16, 2021.
U.S. Appl. No. 17/037,094, filed Sep. 29, 2020.
U.S. Appl. No. 17/037,111, filed Sep. 29, 2020.
U.S. Appl. No. 17/037,117, filed Sep. 29, 2020.
U.S. Appl. No. 17/192,520, filed Mar. 4, 2021.
M. Barth, S. Parthasarathy, Jing Wang, E. Hu, S. Hackwood and G. Beni, "A color vision system for microelectronics: Application to oxide thickness measurements," Proceedings. 1986 IEEE International Conference on Robotics and Automation, San Francisco, CA, USA, 1986, pp. 1242-1247.
Korean Intellectual Property Office, The International Search Report and the Written Opinion for International application No. PCT/US2020/053305, dated Jan. 15, 2021, 12 pg.

* cited by examiner

SYSTEM AND METHOD TO CALIBRATE A PLURALITY OF WAFER INSPECTION SYSTEM (WIS) MODULES

This application claims priority to U.S. Provisional Patent Application No. 62/930,089, entitled, "SYSTEM AND METHOD TO CALIBRATE A PLURALITY OF WAFER INSPECTION SYSTEM (WIS) MODULES," filed Nov. 4, 2019; the disclosure of which is expressly incorporated herein, in its entirety, by reference.

BACKGROUND

The present disclosure relates to the inspection of substrates. In particular, it provides a novel system and method to calibrate wafer inspection system (WIS) modules. In one embodiment, the system and method disclosed herein may be utilized before, during or after processing substrates, such as semiconductor wafers, within a substrate processing system.

Traditional substrate processing systems utilize photolithography processes, which include photoresist coating, exposure, and photoresist develop steps. The materials and processes utilized in these steps may all impact film thickness, critical dimension targeting, line roughness, and uniformity on a substrate. As geometries in substrate processing continue to shrink, the technical challenges to forming structures on substrates increase.

In conventional substrate processing systems, a wafer inspection system (WIS) is often used to inspect a substrate (e.g., a semiconductor wafer) during or after one or more processing steps are performed. For example, a conventional WIS may be used to determine a film thickness (FT) of a layer applied to a surface of a wafer after the wafer is subject to a Post Apply Bake (PAB) procedure to cure or harden the layer. In another example, a conventional WIS may be used to determine a critical dimension (CD) of a structure formed on the wafer after the wafer is developed to form the structure. In some cases, data obtained by the wafer inspection system may be provided to an advanced process control (APC) system for process control and/or to a fault detection system to detect defects on the wafer.

Some wafer inspection system (WIS) modules monitor color differences on the wafer and relate color differences to an FT value or CD value. However, hardware differences between two similar, yet distinct WIS modules may cause each WIS module to interpret color somewhat differently. This may cause each WIS module to produce different inspection results, even when inspecting the same layer or the same wafer.

SUMMARY

Various embodiments of systems and methods for calibrating wafer inspection system modules are disclosed herein. More specifically, the present disclosure provides various embodiments of systems and methods to calibrate the multiple spectral band values obtained from a substrate by a camera system included within a WIS module. In one embodiment, multiple spectral band values are red, green, and blue (RGB) values. As described in more detail below, the calibration methods disclosed herein may use a test wafer having a predetermined pattern of thickness changes or color changes to generate multiple spectral band offset values. The multiple spectral band offset values can be applied to the multiple spectral band values obtained from the substrate to generate calibrated multiple spectral band values, which compensate for spectral responsivity differences between camera systems included within a plurality of WIS modules.

According to one embodiment, a system provided herein may generally include a plurality of wafer inspection system (WIS) modules for monitoring one or more characteristics of a substrate. In such embodiment, each WIS module may comprise (1) a camera system configured to obtain multiple spectral band values from the substrate when the substrate is disposed within the WIS module; and (2) a controller coupled to receive the multiple spectral band values from the camera system, wherein the controller is configured to apply a plurality of multiple spectral band offset values to the multiple spectral band values received from the camera system to generate calibrated multiple spectral band values, which compensate for spectral responsivity differences between the camera systems included within the plurality of WIS modules.

According to another embodiment, a method is to calibrate multiple spectral band values generated by at least one or more wafer inspection system (WIS) modules, wherein each of the at least one or more WIS modules includes a camera system configured to obtain multiple spectral band values from a test wafer, a sample wafer or a substrate disposed within the WIS module and a controller coupled to receive and calibrate the multiple spectral band values. The method may comprise (1) providing the substrate within at least one of the WIS modules to obtain multiple spectral band values for the substrate; and (2) applying multiple spectral band offset values to the multiple spectral band values obtained from the substrate to generate calibrated multiple spectral band values, which compensate for spectral responsivity differences between camera systems included within a plurality of WIS modules.

BRIEF DESCRIPTION OF THE DRAWINGS

A more complete understanding of the present inventions and advantages thereof may be acquired by referring to the following description taken in conjunction with the accompanying drawings, in which like reference numbers indicate like features. It is to be noted, however, that the accompanying drawings illustrate only exemplary embodiments of the disclosed concepts and are therefore not to be considered limiting of the scope, for the disclosed concepts may admit to other equally effective embodiments.

DETAILED DESCRIPTION

Figure 1:
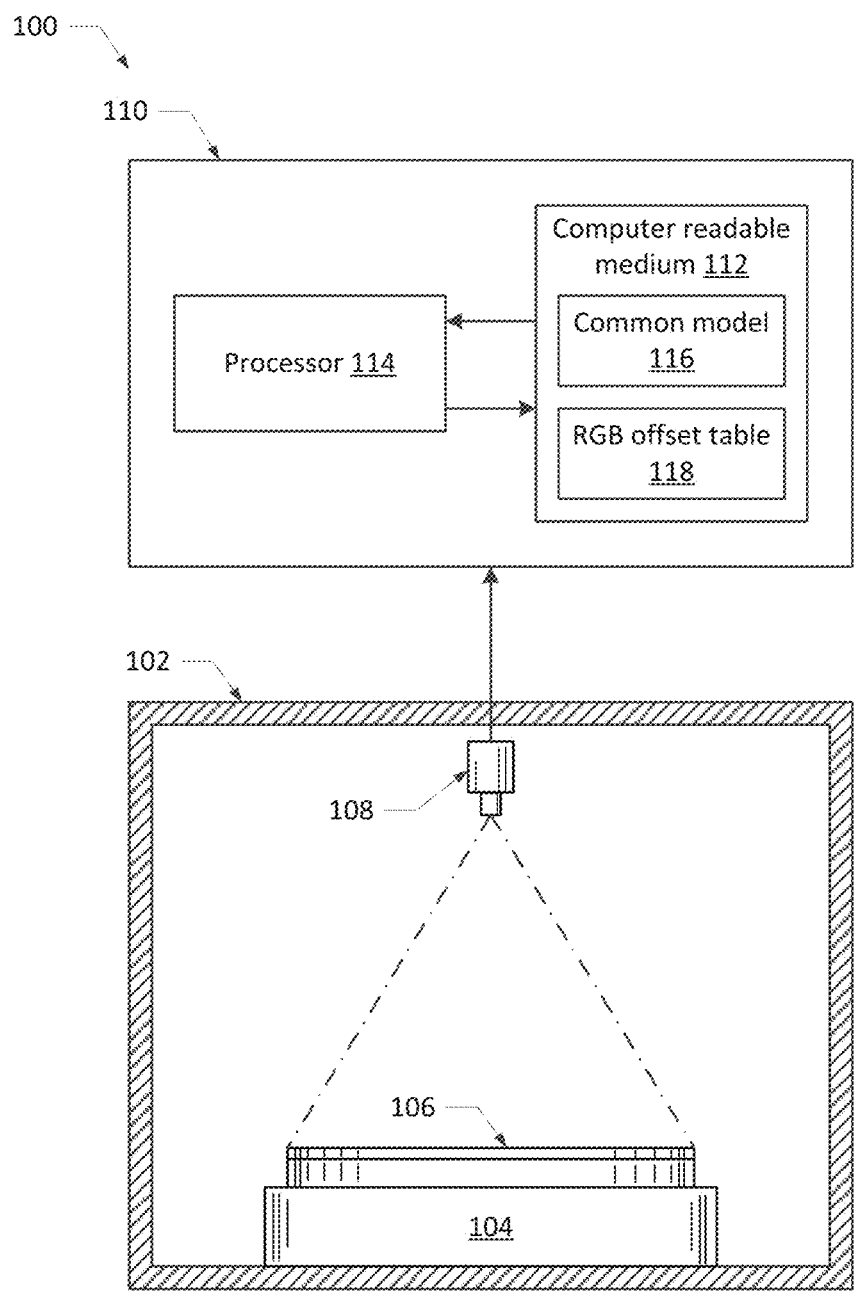
FIG. 1 is a block diagram of a wafer inspection system (WIS) module that includes a camera system and controller to monitor color differences across a wafer.

Various embodiments of systems and methods for calibrating wafer inspection system (WIS) modules are disclosed herein. More specifically, the present disclosure provides various embodiments of systems and methods to calibrate the multiple spectral band values obtained from a substrate by a camera system included within a WIS module. The multiple spectral band values may each be an integrated intensity obtained across a corresponding spectral bands (i.e. band of wavelengths). Thus, for example, the red, green, and blue spectral bands may each have an associated spectral band value, the value being the intensity detected for that band of wavelengths. As described in more detail below, the calibration methods disclosed herein may use a test wafer having a predetermined pattern of thickness changes or color changes to generate multiple spectral band offset values. The multiple spectral band offset values can be applied to the multiple spectral band values obtained from the substrate to generate calibrated multiple spectral band values, which compensate for spectral responsivity differences between camera systems included within a plurality of WIS modules. In one embodiment, the multiple spectral band values are red, green and blue (RGB) values.

As described herein, camera systems are provided to obtain spectral values from a substrate. The cameras and techniques utilized herein may be multispectral or even hyperspectral imaging cameras and techniques. Such cameras and techniques may obtain spectral information from multiple spectral bands, wherein the spectral bands may be one or more wavelengths. In one exemplary embodiment, the cameras and techniques may capture traditional visible red, green, blue (RGB) spectral information. As discussed below, RGB techniques are utilized as merely exemplary spectral bands. It will be recognized, though, that this is merely exemplary and the techniques and apparatus are equally applicable to other visible and non-visible bands of spectral information. Thus, though the particular RGB bands are given in some examples, all the examples may be utilized with other spectral bands of information. Furthermore, though the RGB examples provide three bands of spectral information, it will recognized that the techniques described herein may be applied to more or less than three bands of information. Further, the bands may be narrow (even one wavelength) or broader, such as but not limited to, for example, the broader RGB bands. Moreover the term "camera" as used herein in is not limited to optical sensors that collect visible spectral information. Rather, the term "camera" references any optical detector that collects spectral imaging information. The cameras utilized may be any of a wide variety of optical detectors, for example multispectral cameras (including the subset of hyperspectral cameras), traditional visible light cameras, and other cameras with provide spectral information regarding multiple wavelengths. Exemplary cameras that may be used include the optical detectors disclosed in U.S. patent application Ser. No. 16/880,034, entitled "Optical Diagnostics of a Semiconductor Process Using Hyperspectral Imaging", to Chen et al., filed May 21, 2020, and U.S. patent application Ser. No. 16/880,042, entitled "Optical Diagnostics of a Semiconductor Process Using Hyperspectral Imaging", to Chen et al., filed May 21, 2020, the disclosures both of which are incorporated by reference herein in their entirety.

As noted above, wafer inspection systems are often used to inspect a substrate (such as a semiconductor wafer) during or after one or more processing steps are performed within a substrate processing system. For example, a WIS may determine a film thickness (FT) of a layer applied to a surface of a wafer after the wafer is subject to a Post Apply Bake (PAB) procedure to cure or harden the layer. In another example, a WIS may determine a critical dimension (CD) of a structure formed on the wafer after the wafer is developed to form the structure.

Some wafer inspection system (WIS) modules use a camera to monitor color differences on a substrate, and relate color differences to a film thickness (FT) or critical dimension (CD) value. Unfortunately, current WIS modules that rely on cameras may not always produce uniform inspection results, even when inspecting the same layer or the same wafer. For example, two similar, yet distinct, WIS modules may interpret color differently for the same film and/or substrate, due to hardware differences (e.g., light source spectrum/intensity differences, color sensor spectral responsivity differences, wafer tilt differences, bending mirror differences, etc.) between the WIS modules. Because of these differences, it is difficult to apply a common model (e.g., a single mathematical model that relates or converts color differences detected on a substrate to FT or CD for a particular material) to all WIS modules that inspect that material.

Attempts have been made to calibrate the spectral output of multiple WIS modules by applying a linear offset (e.g., a single color offset) to the common model used to convert color differences to FT or CD for a given material. Unfortunately, applying a single color offset to the common model still fails to produce uniform inspection results across multiple WIS modules due to differences in spectral responsivity of the camera systems used in the modules. For example, when comparing the RGB spectral output of two separate camera systems to thickness changes in silicon dioxide ($SiO_2$) layers formed on a wafer, a significantly greater discrepancy in the spectral responsivity of the camera systems for blue spectral wavelengths than for green (and red) spectral wavelengths may be detected. Further, the discrepancies in the spectral responsivity of the camera systems also change with material. This makes it difficult to achieve uniform inspection results between multiple WIS modules by applying a single color offset to a common model.

The present disclosure provides various embodiments of systems and methods to calibrate multiple WIS modules, where each WIS module includes a camera system configured to obtain red, green and blue (RGB) values from a substrate disposed within the WIS module. Further, a controller is coupled to receive the RGB values from the camera system, wherein the controller is configured to apply a plurality of RGB offset values to the RGB values received from the camera system to generate calibrated RGB values, which compensate for spectral responsivity differences between the camera systems included within the plurality of WIS modules. Once calibrated RGB values are generated, a common model can be applied to the calibrated RGB values to convert color differences detected on the substrate to a film thickness (FT) or critical dimension (CD) value.

FIG. 1 illustrates one embodiment of a wafer inspection system (WIS) module 100 that may be used to monitor one or more characteristics of a substrate (such as a semiconductor wafer) after one or more processing steps (e.g., a coating process, a bake process, a develop process, etc.) have been performed to process the substrate. More specifically, FIG. 1 illustrates one embodiment of a WIS module 100 that uses a camera system 108 to monitor color differences on a substrate and a controller 110 to relate color differences detected by the camera system to a film thickness (FT) or critical dimension (CD) value.

In some embodiments, WIS module 100 may be integrated within a substrate processing system for inspecting substrates as they are processed within the substrate processing system. In other embodiments, WIS module 100 may be a stand-alone module located outside of a substrate processing system. It will be recognized, however, that the WIS module 100 shown in FIG. 1 is merely exemplary and that the methods described herein may be used to calibrate other embodiments of WIS modules that utilize a camera system to monitor color differences on a substrate and a controller to relate color differences to a film thickness (FT) or critical dimension (CD) value.

As shown in FIG. 1, WIS module 100 is bounded by an outer wall 102 and includes a support structure 104 for supporting a substrate (e.g., a wafer) 106, while the substrate is disposed within the WIS module for inspection. Camera system 108 is disposed within the WIS module 100. In some embodiments, camera system 108 may be coupled to an inner surface of outer wall 102 and centered above the substrate 106, as shown in FIG. 1, so that a field of view (FOV) of camera system 108 captures the entire upper surface of the substrate 106. It will be recognized, however, that the camera position shown in FIG. 1 is merely one example, and that camera system 108 may be alternatively positioned within the WIS module 100, in other embodiments. Further, mirrors or other optics may be utilized to direct an image to a camera system that may be located elsewhere to the WIS module. For example, a mirror could be located at the position of the camera of FIG. 1 to direct the image on a camera that is located in a plane parallel to the plane of the substrate 106 of FIG. 1.

Camera system 108 may generally include a light source and a photoreceptive sensor. It is noted, however, that a wide variety of camera systems may be utilized, including but not limited to, charged coupled device (CCD) image sensor cameras, complementary metal oxide semiconductor (CMOS) image sensor cameras, N-type metal-oxide-semiconductor (NMOS) image sensor cameras, indium gallium arsenide (InGaAs) image sensor cameras, indium antimony (InSb) image sensor cameras, etc.

The light source included within camera system 108 may typically be a light source of the visible spectrum or longer. For example, light sources in the visible spectrum, near-infrared (NIR), shortwave-infrared (SWIR) and mid-infrared (MIR) represent exemplary light sources that may be used within camera system 108 to illuminate a surface of the substrate 106.

The photoreceptive sensor (e.g., CCD, CMOS, NMOS, etc.) of camera system 108 detects light reflected from the surface of the substrate 106 and converts the detected light into a line scan or matrix of raw RGB values. The RGB values output from camera system 108 are provided to controller 110 for further processing.

Controller 110 may generally include a computer readable medium 112 having stored program instructions and/or data, and a processor 114 to execute the program instructions stored within computer readable medium 112. As shown in FIG. 1, the program instructions and/or data stored within computer readable medium 112 may include one or more of a common model 116 and at least one RGB offset table 118. In some embodiments, a separate common model 116 and a separate RGB offset table 118 may be stored within computer readable medium 112 for a variety of different materials and/or layers. For example, the analysis may be performed on a substrate that has a variety of underlying layers with a variety of overlying layers. The underlying layer may be any of a wide variety of layers, including but not limited to, silicon, amorphous silicon, polysilicon, silicon dioxide, other oxides, silicon carbide, other carbides, silicon nitride, other nitrides, etc. Further, the material of the overlying layer applied to the underlying layer may be any of a wide variety of types, including but not limited to, a resist layer, a silicon dioxide layer, antireflective coating (ARC) layer (bottom antireflective coatings or topside antireflective coatings), silicon antireflective layers, spin on carbon layers, spin on glass layers, etc. Thus, the program instructions and data may comprise a plurality of common models and a plurality of RGB offset tables, wherein each common model and each RGB offset table corresponds to a different material that could be applied to a different surface type of the substrate.

In some embodiments, program instructions for generating RGB offset table(s) 118 may also be stored within computer readable medium 112 and executed by processor 114. Alternatively, such processing may be performed by other controllers separate from the WIS module 100.

As described in more detail below, controller 110 may apply an RGB offset table 118 for a particular material to the raw RGB values output from camera system 108 to generate calibrated RGB values. Once calibrated RGB values are generated, controller 110 may apply a corresponding common model 116 to the calibrated RGB values to convert color differences detected on substrate 106 to a film thickness (FT) or critical dimension (CD) value. By applying common model 116 and RGB offset table 118 to the RGB values output from camera system 108, controller 110 compensates for spectral responsivity differences between camera systems included within separate WIS modules, thus producing uniform inspection results (e.g., uniform FT or CD values) for a given material applied to substrate 106.

As described in more detail below, one or more of a RGB offset table 118 may be generated using one or more test wafers having a predetermined pattern of thickness changes and/or color changes. The present disclosure contemplates various embodiments of test wafers having a predetermined pattern of thickness changes and/or color changes, and methods for creating such test wafers. In such embodiments, a test wafer created using a particular material may be used to generate an RGB offset table 118 for that material.

In some embodiments, a test wafer may be used to calibrate multiple WIS modules included within the same track (or between tracks) of a substrate processing system. In other embodiments, a test wafer may be used to calibrate multiple, stand-alone WIS modules.

In some embodiments, a test wafer may be created on-the-fly, while substrates are undergoing processing (i.e., at the time of use). In other embodiments, a test wafer may be created sometime before it is needed to calibrate one or more WIS modules. For example, pre-made test wafers could reside in the track in a standby station for regular auto-calibration routines, or in a wafer carrier for manual calibration routines between tracks.

It is noted that the processor(s) shown and described herein can be implemented in a wide variety of manners. In one example, processor 114 may be a computer. In another example, processor 114 may include one or more programmable integrated circuits, which are programmed to provide the functionality described herein. For example, one or more processors (e.g., a microprocessor, microcontroller, central processing unit (CPU), digital signal processor (DSP), etc.), programmable logic devices (e.g., complex programmable logic device (CPLD)), field programmable gate array (FPGA), etc.), and/or other programmable integrated circuits (e.g., an application specific integrated circuit (ASIC), etc.) can be programmed with software or other program instructions to implement the functionality described herein for processor 114.

It is further noted that the software or other program instructions can be stored in a computer readable medium 112 that is one or more non-transitory computer readable mediums, and the software or other program instructions when executed by processor 114 cause the processor to perform the processes, functions, and/or capabilities described herein. Examples of a non-transitory computer readable mediums include, but are not limited to, computer readable memory (e.g., read only memory (ROM), random access memory (RAM), flash memory, etc.) and computer readable storage devices (e.g., hard disk drives (HDD), solid state drives (SDD), floppy disks, DVDs, CD-ROMs, etc.). Other variations could also be implemented.

As noted above, the calibration method described herein uses test wafer(s) to generate RGB offset table(s) 118. In some embodiments, the test wafer(s) described herein may have a predetermined pattern of thickness changes across the wafer (see, e.g., FIGS. 2A-2B). In other embodiments, the test wafer(s) may have a predetermined pattern of color changes across the wafer (see, e.g., FIG. 3). Running these test wafers through a series of WIS modules enables controller 110 (or another processor) to construct RGB offset table(s) 118, which compensate for output differences between multiple WIS modules. In some embodiments, controller 110 (or another processor) may utilize the test wafer(s) to create a separate RGB offset table 118 for each of a plurality of materials or layers that may be applied to substrate 106.

There are many different ways in which a test wafer having a predetermined pattern of thickness changes may be created. The present disclosure contemplates at least five different methods for creating a test wafer having a predetermined pattern of thickness changes (e.g., wedges, radials, steps, concave structures, convex structures, etc.) within a substrate processing track, and two different methods for creating a test wafer using the substrate processing track, as well as additional tools and/or processes outside of the substrate processing track. It will be recognized, however, that one skilled in the art would understand how additional methods not explicitly set forth herein may also be used to generate test wafers having a predetermined pattern of thickness changes.

In a first embodiment, a hot plate with a programmable array of lift devices (as described, e.g., in U.S. Pat. No. 9,978,618) can be used to create a predetermined pattern of wedges on a test wafer. In the first embodiment, a coated wafer is provided on the hot plate and a wedge air gap is created between the coated wafer and the hot plate to produce a temperature difference across the wafer. The temperature difference induces a pattern of thickness changes (e.g., wedges) across the wafer, due to the difference in the bake air gap condition. In the first embodiment, the test wafer may be created using substantially any material. Such an embodiment encompasses directly the difference of remaining solvent in a polymer matrix from bake effects. Further, it may encompass the use of a thermal based crosslinking material in which thickness changes may be induced based on amount of crosslinking which is temperature dependent.

Figure 2A:
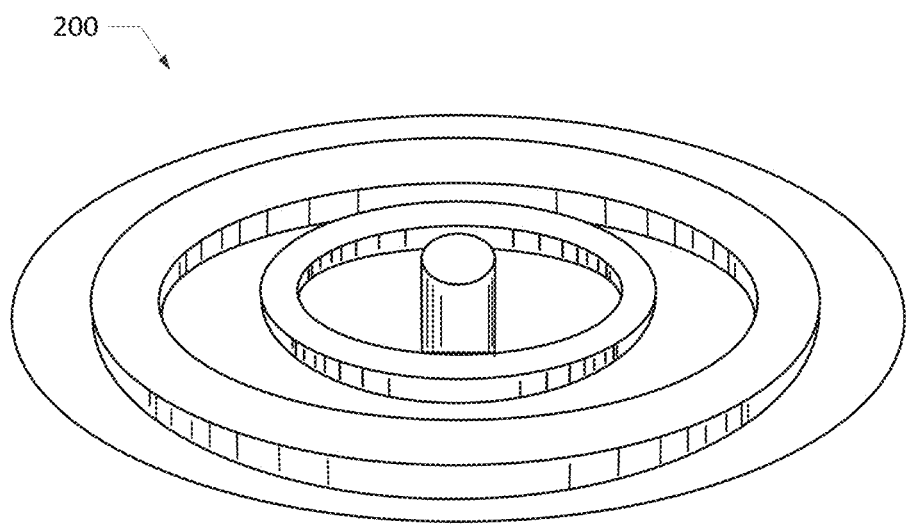
FIG. 2A is a perspective view illustrating one embodiment of a test wafer having a predetermined pattern of thickness changes.
Figure 2B:
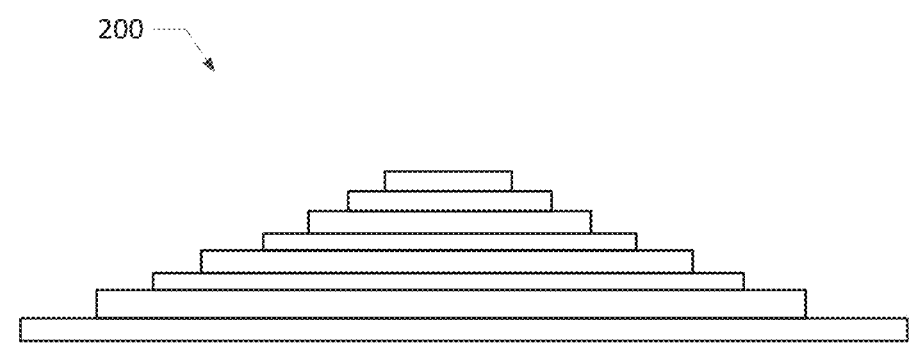
FIG. 2B is a side view of the test wafer shown in FIG. 2A.
Figure 2C:
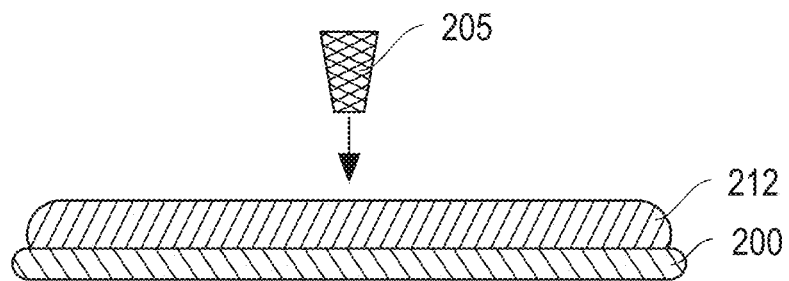
FIGS. 2C-2N illustrate exemplary methods for forming test wafers having thickness variations.

In a second embodiment, a multi-coat method combined with variable nozzle position can be used to create a predetermined pattern of radially dependent thickness changes across a test wafer. FIGS. 2A and 2B illustrate one example of a test wafer 200 having radially dependent thickness changes. As shown in the figures for illustrative purposes, abrupt thickness variations are shown but it will be recognized the thickness variations may be less abrupt or a continuous gradual change. A wide variety of methods may be utilized to create a test wafer having differing coating thicknesses through the use of variable nozzle positions. FIGS. 2C-2H illustrate a method using variable nozzle positions for both coating and applying a solvent. FIGS. 2I-2L illustrate a method using just a variable nozzle position for coating. FIGS. 2M-N illustrate a method using just a variable nozzle position for applying a solvent.

Figure 2D:
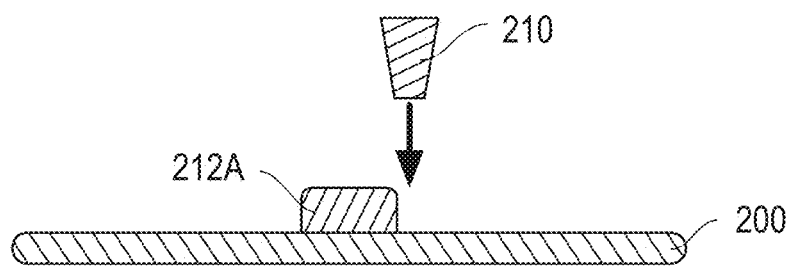
Figure 2E:
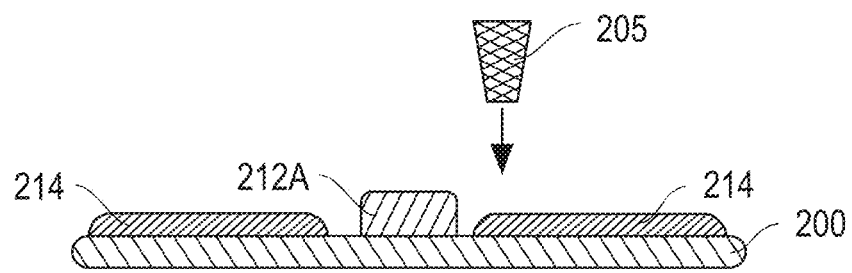
Figure 2F:
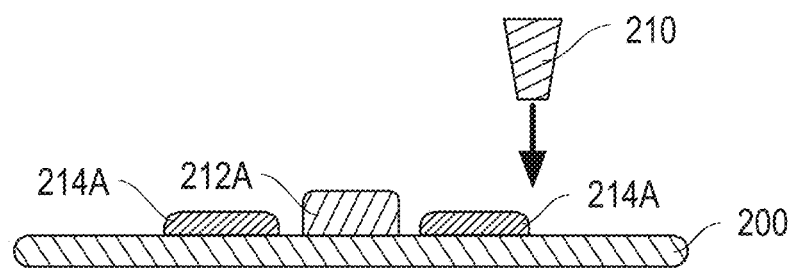
Figure 2G:
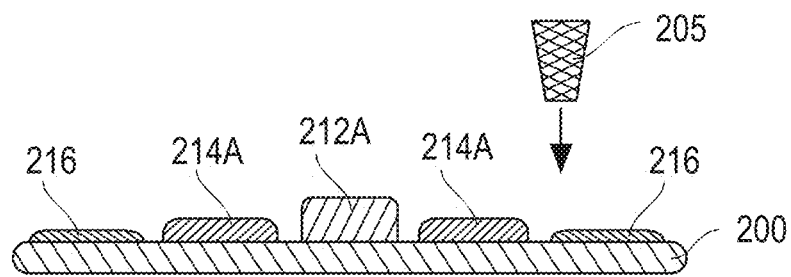
Figure 2H:
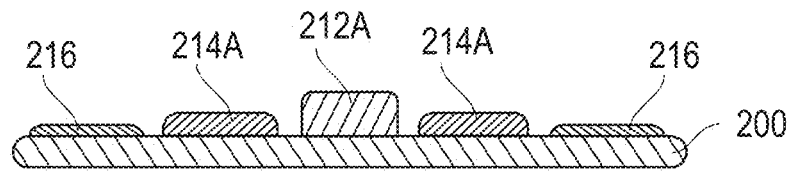
Figure 2I:
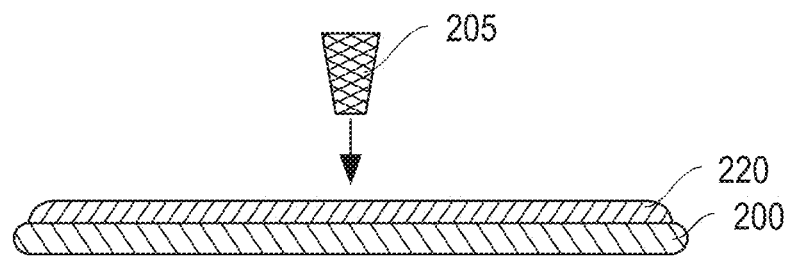
Figure 2J:
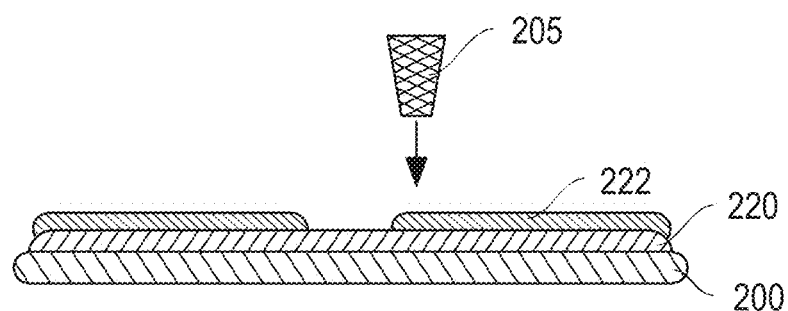
Figure 2K:
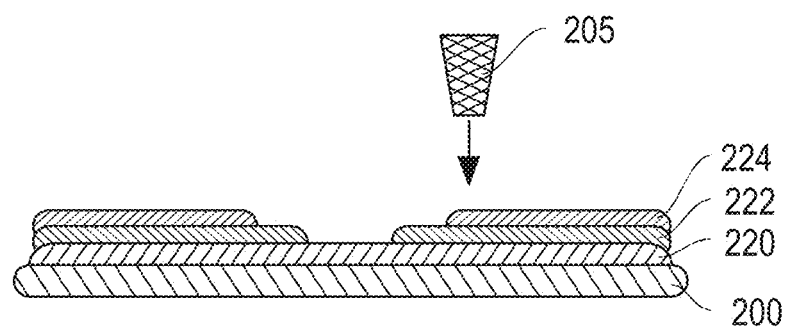
Figure 2L:
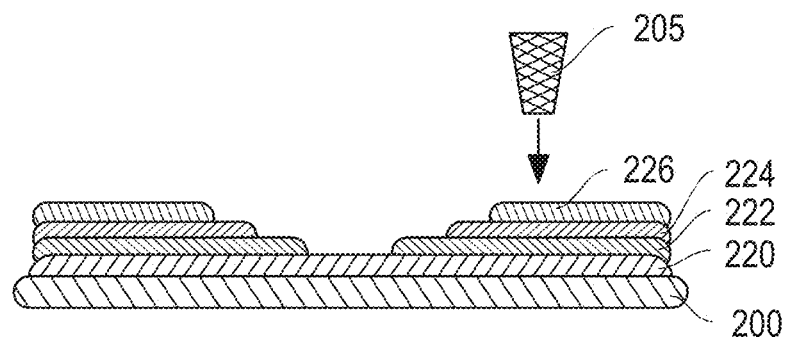
Figure 2M:
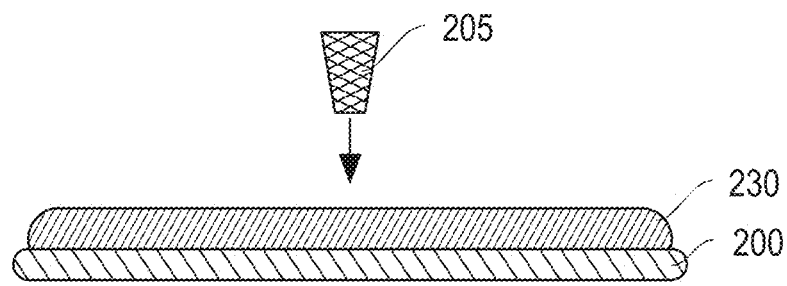
Figure 2N:
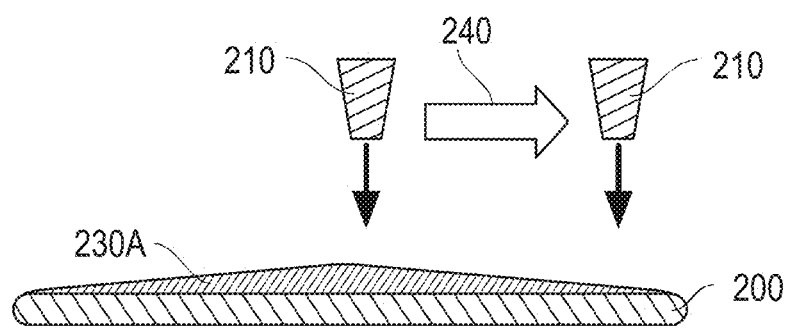

As shown in FIGS. 2C-2H, a test wafer 200 may first be spin coated with a layer 212 using a coating nozzle 205 located at the center of the test wafer. The revolutions per minute (RPM) of the spin coating may be a standard RPM value. Then, as shown in FIG. 2D, a solvent may be applied with a solvent nozzle 210 to remove a portion of the layer 212. As shown in FIG. 2D, the solvent nozzle may be offset from center so as to leave portion 212A of the layer 212 on the test wafer. At this point, the test wafer may be subjected to a bake process. Next as shown in FIG. 2E, a layer 214 of a different thickness than layer 212 may be applied to the test wafer using a coating nozzle 205 which is offset from the center of the test wafer and using a higher RPM than used to form layer 212. As shown in FIG. 2F, a solvent may then be applied to the test wafer having the solvent nozzle 210 offset even further than shown in FIG. 2D so as to leave portions 214A of layer 214 on the test wafer. Another bake process may then be performed. Then, as shown in FIG. 2G, a layer 216 of yet another thickness different than layer 212 or layer 214 may be applied to the test wafer using a coating nozzle 205 which is offset from the center of the test wafer even more than the offset of FIG. 2E and at an even higher RPM than used to form layer 214. The test wafer may again be subject to a bake process. The resulting test wafer 200 having layers and/or portions of layers 212A, 214A and 216 of differing thicknesses is shown in FIG. 2H. It will be recognized that the embodiment of FIGS. 2C-2H is not limited to three coating steps but rather the process may utilize more separate coating steps to provide more thickness variations across the test wafer.

FIGS. 2I-2L illustrate an example method of forming thickness variations on a test wafer by moving the coating nozzle 205 for the formation of successive layers. In such an embodiment, the coatings additive is applied such that a concave profile is obtained center to edge across the test wafer. As shown in the figures, the coating nozzle 205 may be centered to form layer 220. A bake process may then occur. Then, the coating nozzle may be progressively moved to form each layer 222, 224, and 226 (followed by a bake after each layer is formed) as shown in the figures.

FIGS. 2M-2N illustrate a technique based upon movement of the solvent nozzle 210. In the embodiment of FIGS. 2M-2N, the process is subtractive such that a convex profile is obtained center to edge across the test wafer. As shown in FIG. 2M, a test wafer is coated with a layer 230. Then as shown in FIG. 2N, a solvent is applied from a solvent nozzle 210 while the solvent nozzle is moved from a center position to an edge position as indicated by the movement arrow 240. Such an application of the solvent may result in a layer 230A which has a gradual thickness profile change as shown.

In a third embodiment, a developer or etchant (e.g., Tetramethylammonium hydroxide (TMAH) or a solvent) and linear scan low impact puddle method can be used to create a predetermined pattern of thickness changes (e.g., wedges) on a test wafer. In one example implementation, a standard (e.g., 2.36%) or higher concentration TMAH could be paired with variable develop contact time with the material (defined, for example, by the nozzle scan rate) before the TMAH is rinsed off. In another example implementation, a solvent could be used with a similar linear scan low impact puddle method to create a predetermined pattern of thickness changes on a test wafer. Although a variety of different materials may be used in the third embodiment, some recipe optimization (e.g., nozzle scan rate) may be utilized for each material.

In a fourth embodiment, the test wafer may be exposed on a stepper/scanner in which the doses exposed on the test wafer vary between 0 and Eo (energy to clear) for a resist. In this embodiment, a partial, sub-Eo (energy to clear) exposure could be used to create a predetermined pattern of thickness changes. For example, depending upon the material being coated and the exposure technique used differing thickness changes may be obtained from 0 to 100% of the original coating thickness. In one example implementation, a wafer edge exposure (WEE) system can be used to create the test wafer of varying resist thicknesses. Within the WEE system, for example, a variable edge exposure could be induced by hardware (e.g., by varying aperture size during slow rotation), or by a programmed step antireflective coating (ARC) exposure process. Once processed by the WEE system, the test wafer can be subjected to a Post Exposure Bake (PEB) process followed by a Develop (DEV) process. In the case of use of a DEV process with a variable exposure, a full range of thickness variation from 0 to 100% may be obtained. Without the development process, the change of thickness may still induce a loss of up to 20% of the film thickness due to outgassing of byproducts from the deprotection event of the exposure. To ensure a significant number of thickness steps/variations are created on the test wafer, a diluted develop solution may be used in the DEV process to slow down the solvation process of the exposed areas. Such a method is particularly suited for resist materials. In the ARC process, having crosslinking based on exposure, the crosslinking impact on thickness may depend on the nature of outgassing of crosslinking byproduct or not. Typically up to 15% film thickness loss may occur if the byproduct does not outgas and upwards of 50% film thickness loss may occur if the byproduct can outgas depending on percentage of crosslinking.

In a fifth embodiment, other track based exposure systems could be used to create a predetermined pattern of thickness changes, for example in resist layers. A variety of mechanisms may be utilized including the use of various exposure wavelengths. For example, such systems may be used to create the patterned thickness changes on the test wafer via crosslinking, oxidation, bond breaking or deprotection for some, if not most, materials. In some embodiments, two exposure wavelengths such as 172 nm and 365 nm may be used but other wavelengths up to the mid UV range are also known. In one embodiment, oxidation and/or bond breaking mechanism may be utilized. In this embodiment, short wavelength UV light (for example peak value 172 nm) may be used to break up the bonds in organic substances. In air, additional generation of ozone oxidizes these contaminants into carbon dioxide and water. In another mechanism, crosslinking is utilized. For example, some crosslinking catalyst may react at 172 nm. Other crosslinking catalyst may be tailored to wavelengths in the deep and mid UV. Further, deprotection mechanism may be induced based typically on photo-acid generator (PAG) absorption. PAGs have been tailored at 193 nm, 248 nm, 365 nm wavelengths. In one example of track based systems, a line bar exposure with a stage that scans underneath the exposure bar may be utilized. In this system, scan rate (among other things) can be used to control/induce programmatic exposure dose thru scan to induce a gradient in the direction of scan. A single lamp with linear scan stage exposure system and/or a multiple lamp exposure system can be used to expose the test wafer near 172 nm. In one example implementation, one or more of these systems could be used to achieve variable oxidation via, for example, scan rate (in a single lamp with linear scan stage exposure system) or lamp power configuration (in a multiple lamp exposure system). In these embodiments, the film thickness variation may be from 0 to 100% of the original film thickness depending upon exposure time. Crosslinking based film thickness loss depends on the nature of outgassing of crosslinking byproduct or not. Typically up to 15% film thickness loss may be seen if byproduct does not outgas and upwards of 50% film thickness loss may occur if byproduct can outgas depending on percentage of crosslinking induced. For deprotection without the development process, the change of deprotection level may induce 0 to 20% film thickness loss associated with outgassing of byproduct from deprotection event, but with development, that same deprotection level may allow 0 to 100% film thickness loss.

In the first five embodiments, methods were described for creating a predetermined pattern of thickness changes on a test wafer using systems/processing modules within (in-situ to) the substrate processing track. In the next series of embodiments, methods are described for creating a predetermined pattern of programmed thickness changes on a test wafer using the substrate processing track, as well as additional tools and processes outside of the substrate processing track.

In a sixth embodiment, a finely stepped, open frame dose stepping, resist coated test wafer may be exposed on a stepper/scanner in which the doses exposed on the test wafer vary between 0 and Eo (energy to clear) for a resist, followed by PEB and DEV processing, to create a predetermined pattern of stepped thickness changes across the test wafer. In its simplest form, the test wafer created in the sixth embodiment may be exposed as a dose meander exposure process. However, to prevent any WIS optical systematic effects from affecting the RGB offset determination for multiple WIS modules, a random fine open frame dose stepping process is potentially preferred. This method, without additional processing, is applicable to resist materials.

In a seventh embodiment, a test wafer created in accordance with the sixth embodiment could be subjected to subsequent processing. For example, the resist created in the sixth embodiment could serve as a masking layer to transfer similar stepped thickness changes into other materials of interest.

Figure 3:
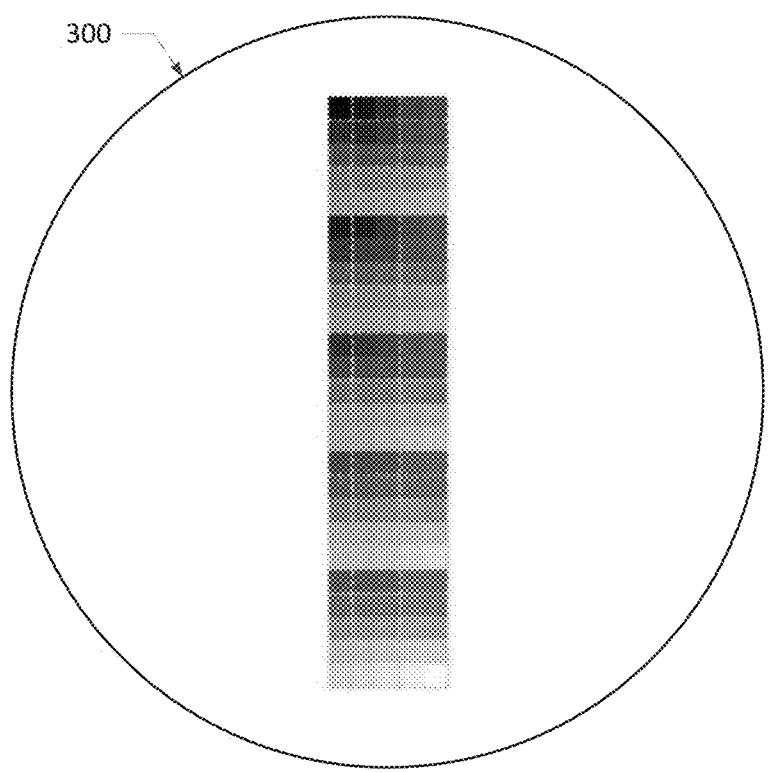
FIG. 3 is a top view illustrating one embodiment of a test wafer having a predetermined pattern of color changes.

The present disclosure also contemplates ways in which a test wafer having a predetermined pattern of color changes could be created. For example, color printer technology and a low roughness substrate (such as polyethylene) can be used to make a color printed test wafer 300, as shown in FIG. 3. In this embodiment, different color samples may be transferred on the color printed test wafer 300 using a color printer. The color samples may cover a wide range of colors. In one example, the range of colors may cover the colors of the visible spectrum as common camera systems are responsive to such ranges. The use of a wide ranging color palette may provide for colors corresponding to the wide range of spectral reflectivity results that different materials (and on different underlying layers) may create with differing thicknesses. Such a color palette allows a ground truth color (assuming little variation in creation of color palette) to be established that cameras can be calibrated back to. If the ground truth color is observed in the same way across a WIS module after calibration, the spectral reflectivity result for that material may be seen in similar way across differing WIS modules. The color palettes of FIG. 3 may all be differing colors. In an alternative embodiment, the same color palettes could be repeated in different locations across a substrate so as to detect spectral variations that are seen that result from system variations that may be substrate location dependent.

After a test wafer for a particular material (e.g., $SiO_2$) is created, the test wafer may be run through a series of WIS modules such as WIS module 100, for example, to create an RGB offset table 118 that can be used to calibrate the raw RGB values produced by each WIS module when inspecting a substrate 106 comprising that material. While the test wafer is disposed within a given WIS module 100, light reflected from the test wafer is detected by camera system 108 and converted into a line scan or matrix of raw RGB values, which are provided to controller 110. Controller 110 receives the RGB values obtained for the test wafer from each of the WIS modules, and compares the RGB values obtained for the test wafer to RGB values obtained for a sample wafer (e.g., a wafer processed by, or undergoing processing within, a semiconductor processing system) to determine an offset value for each color channel (red, green and blue).

In some embodiments, controller 110 may compare RGB values by generating a 3-D scatter plot of the RGB values obtained from the test wafer and the sample wafer, and averaging the RGB values for the test wafer and averaging the RGB values for sample wafer contained in each color cell of the 3-D scatter plot. Once average RGB values are determined, offset values (e.g., a delta or ratio) for each color channel (red, green and blue) can be calculated according to the following equations.

$$R_{delta}(R_{sample}, G_{sample}, B_{sample}) = R_{test} - R_{sample}$$

$$R_{ratio}(R_{sample}, G_{sample}, B_{sample}) = \frac{R_{test}}{R_{sample}}$$

In the equations above, offset values for each color channel (e.g., $R_{delta}$ or $R_{ratio}$) are calculated by determining a difference (delta) or ratio between the average RGB values for the test wafer ($R_{test}$) and the average RGB values for the sample wafer ($R_{sample}$) within each color cell of the 3-D scatter plot. Although demonstrated for the R channel only, it is noted that similar equations can be used to calculate offset values (e.g., $G_{delta}$ or $G_{ratio}$ and $B_{delta}$ or $B_{ratio}$) for the G and B channels. In some embodiments, an interpolation method (e.g., linear, spline, Shepard, Kriging, etc.) may be applied to the data. Using interpolation methods allows for creating a continuous color response from a set number of discrete color palette colors. Thus, the number of colors in the test wafer may be smaller than the number of colors detected on the substrate that the model supports.

Once RGB offset values are determined for a particular material, they may be stored as an RGB offset table 118 within each of the WIS modules, and used to calibrate RGB values subsequently obtained by the WIS modules when inspecting a substrate 106 including the same material provided on the test wafer. However, storing of the RGB offset values may also be done outside of the WIS modules, for example in a separate connected computing or processing unit. When a substrate 106 including the particular material is subsequently provided within a WIS module 100, the RGB offset table 118 for that material may be used to calibrate the raw RGB values, which are obtained from the substrate 106 by camera system 108. By applying at least one common model 116 to the calibrated RGB values, rather than the raw RGB values received from camera system 108, controller 110 compensates for spectral responsivity differences between camera systems included within separate WIS modules, thus producing uniform inspection results (e.g., uniform FT or CD values) for a given material applied to substrate 106.

In some embodiments, the RGB offset values stored within an RGB offset table 118 may be applied to the raw RGB values obtained from a substrate 106 to generate calibrated RGB values for any position in the RGB parameter space. For example, calibrated red values may be calculated according to the following equations.

$$R_{calibrated} = R_{sample} + R_{delta}(R_{sample}, G_{sample}, B_{sample})$$

$$R_{calibrated} = R_{sample} \times R_{ratio}(R_{sample}, G_{sample}, B_{sample})$$

Again, although demonstrated for R values, it is noted that similar equations can be used to calibrate G and B values at any position in the RGB parameter space.

Figure 4:
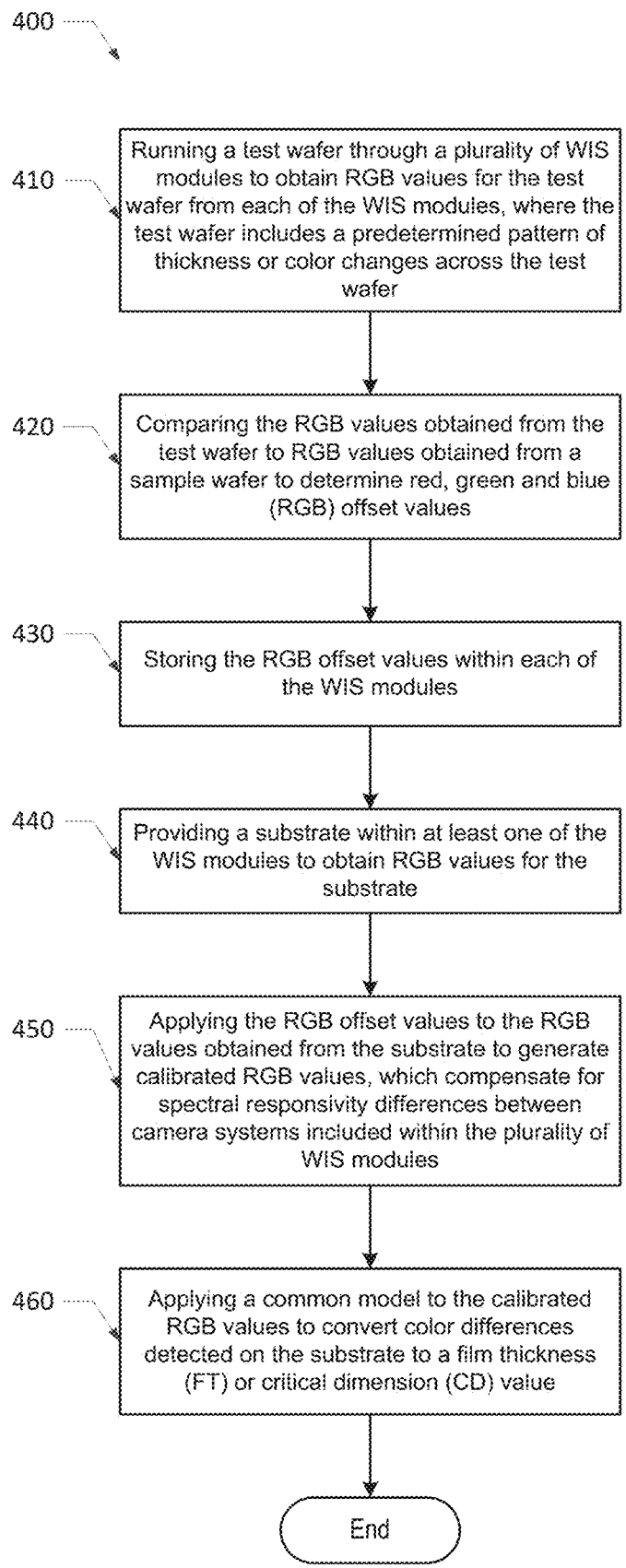
FIG. 4 is a flowchart diagram illustrating one embodiment of a method to calibrate RGB values obtained from a substrate by camera systems included within a plurality of WIS modules.

FIG. 4 illustrates one embodiment of a method that implements the calibration techniques described herein. More specifically, FIG. 4 illustrates one embodiment of a method 400 to calibrate RGB values generated by a wafer inspection system (WIS) module using a test wafer having a predetermined pattern of thickness changes or color changes. Although not strictly limited to such, the method shown in FIG. 4 may be used to calibrate a plurality of WIS modules, which may be integrated within a substrate processing system and/or standalone WIS modules coupled to a substrate processing system. As noted above, each WIS module may generally include a camera system 108 to obtain red, green and blue (RGB) values from a test wafer, a sample wafer or a substrate disposed within the WIS module, and a controller 110 coupled to receive and calibrate the RGB values.

It will be recognized that the method shown in FIG. 4 is merely exemplary and additional methods may utilize the techniques described herein. It is further noted that additional steps may be added to the method shown in the FIG. 4 as the steps described are not intended to be exclusive. Moreover, the order of the steps is not limited to the order shown in FIG. 4 as different orders may occur and/or various steps may be performed in combination or at the same time. Further, the techniques provided herein may omit some of the steps of FIG. 4.

As shown in FIG. 4, method 400 may begin, in some embodiments, by running a test wafer through a plurality of WIS modules for obtaining RGB values for the test wafer run through each of the WIS modules (in step 410). The test wafer is one, which includes a predetermined pattern of thickness changes or color changes across the test wafer. In step 420, method 400 compares the RGB values obtained from the test wafer to RGB values obtained from a sample wafer to determine red, green and blue (RGB) offset values. In step 430, the RGB offset values are stored, at least temporarily, within each of the WIS modules.

In step 440, a substrate is provided within at least one of the WIS modules to obtain RGB values for the substrate. In step 450, the RGB offset values determined in step 420 are applied to the RGB values obtained from the substrate in step 440 to generate calibrated RGB values, which compensate for spectral responsivity differences between the camera systems included within the plurality of WIS modules. In step 460, a common model is applied to the calibrated RGB values to convert color differences detected on the substrate to a film thickness (FT) or critical dimension (CD) value. By applying the common model to the calibrated RGB values generated in step 450, rather than the raw RGB values obtained in step 410, method 400 compensates for spectral responsivity differences between camera systems included within separate WIS modules, thus producing uniform inspection results (e.g., uniform FT or CD values) for a given material applied to the substrate.

As mentioned above, in some embodiments less than all the steps of FIG. 4 may be utilized. For example, one exemplary method may be used to calibrate RGB values generated by a wafer inspection system (WIS) module, wherein the WIS module includes a camera system configured to obtain red, green and blue (RGB) values from a test wafer, a sample wafer or a substrate disposed within the WIS module and a controller coupled to receive and calibrate the RGB values. This method may comprise only step 440 and step 450 of FIG. 4.

In some embodiments, method 400 may create a test wafer having a predetermined pattern of thickness changes prior to running the test wafer (in step 410). A test wafer with a predetermined pattern of thickness changes may be created using any of the methods described above.

For example, in a first embodiment, a test wafer with a predetermined pattern of thickness changes may be created by providing a coated test wafer on a hot plate having a programmable array of lift devices, and creating a wedge air gap between the coated test wafer and the hot plate to produce a temperature difference across the coated test wafer, which induces a predetermined pattern of wedges across the test wafer. In a second embodiment, a test wafer with a predetermined pattern of thickness changes may be created by using a multi-coat method combined with variable nozzle position to create a predetermined pattern of radially dependent thickness changes across the test wafer. In a third embodiment, a test wafer with a predetermined pattern of thickness changes may be created by using a linear scan low impact puddle method combined with variable develop contact time with a developer or solvent to create a predetermined pattern of wedges on the test wafer. In a fourth embodiment, a test wafer with a predetermined pattern of thickness changes may be created by using a variable edge exposure followed by a Post Exposure Bake (PEB) process and a Develop (DEV) process to create a predetermined pattern of 0 to 100% of the original film thickness depending upon the particular methods and materials used on the test wafer as described above. In a fifth embodiment, a test wafer with a predetermined pattern of thickness changes may be created by using a single lamp with linear scan stage exposure system or a multiple lamp exposure system to create a predetermined pattern of 0 to 100% of the original film thickness depending upon the particular methods and materials used on the test wafer as described above for the crosslinking, oxidation, bond breaking or deprotection mechanisms. In a sixth embodiment, a test wafer with a predetermined pattern of thickness changes may be created by using a stepper/scanner to expose an open frame dose stepping, resist coated test wafer, followed by a Post Exposure Bake (PEB) process and a Develop (DEV) process, to create a predetermined pattern of stepped thickness changes on the test wafer.

In other embodiments, method 400 may create a test wafer having a predetermined pattern of color changes prior to running the test wafer (in step 410). For example, a test wafer with a predetermined pattern of color changes may be created using a color printer to transfer or print a number of different color samples onto a test wafer, as shown in FIG. 3.

In some embodiments, method 400 may create the test wafer on-the-fly, while substrates are undergoing processing. In other embodiments, the test wafer may be pre-made and stored in a standby station for regular auto-calibration routines, or stored in a wafer carrier for manual calibration routines.

As mentioned above, the cameras and techniques utilized herein may be multispectral or even hyperspectral imaging cameras and techniques. Such cameras and techniques may obtain spectral information from multiple spectral bands, wherein the spectral bands may be one or more wavelengths. In some exemplary embodiments described above, the cameras and techniques may capture traditional visible red, green, blue (RGB) spectral information. RGB techniques are utilized as merely exemplary spectral bands. It will be recognized, though, that this is merely exemplary and the techniques and apparatus are equally applicable to other visible and non-visible bands of spectral information. Thus, though the particular RGB bands are given in some examples, all the examples may be utilized with other spectral bands of information. Furthermore, though the RGB examples provide three bands of spectral information, it will recognized that the techniques described herein may be applied to more or less than three bands of information. Further, the bands may be narrow (even one wavelength) or broader, such as but not limited to, for example, the broader RGB bands. The cameras utilized may be any of a wide variety of optical sensors, for example multispectral cameras (including the subset of hyperspectral cameras), traditional visible light cameras, and other cameras which provide spectral information regarding multiple wavelengths.

It will be recognized that the method embodiments disclosed herein may be utilized before, during or after a wide range of substrates have been processed in a processing unit, such as a liquid dispense unit, a baking unit or a combined bake module. The substrate may be any substrate for which the patterning of the substrate is desirable. For example, in one embodiment, the substrate may be a semiconductor substrate having one or more semiconductor processing layers (all of which together may comprise the substrate) formed thereon. Thus, in one embodiment, the substrate may be a semiconductor substrate that has been subject to multiple semiconductor processing steps which yield a wide variety of structures and layers, all of which are known in the substrate processing art, and which may be considered to be part of the substrate. For example, in one embodiment, the substrate may be a semiconductor wafer having one or more semiconductor processing layers formed thereon.

Further modifications and alternative embodiments of the inventions will be apparent to those skilled in the art in view of this description. Accordingly, this description is to be construed as illustrative only and is for the purpose of teaching those skilled in the art the manner of carrying out the inventions. It is to be understood that the forms and method of the inventions herein shown and described are to be taken as presently preferred embodiments. Equivalent techniques may be substituted for those illustrated and described herein and certain features of the inventions may be utilized independently of the use of other features, all as would be apparent to one skilled in the art after having the benefit of this description of the inventions.

What is claimed is:

1. A system, comprising:
a plurality of wafer inspection system (WIS) modules for monitoring one or more characteristics of a substrate, wherein each WIS module comprises:
   a camera system configured to obtain multiple spectral band values from the substrate when the substrate is disposed within each of the WIS modules; and
   a controller coupled to receive the multiple spectral band values from the camera system, each of the multiple spectral band values being associated with a calculated light intensity across a band of wavelength, wherein the controller is configured to apply multiple spectral band offset values to the multiple spectral band values received from the camera system to generate calibrated multiple spectral band values, which compensate for spectral responsivity differences between the camera systems included within the plurality of WIS modules, wherein different ones of the multiple spectral band offset values are applied to different bands of wavelengths.

2. The system of claim 1, wherein the controller comprises a computer readable medium configured to store program instructions and data, and a processor configured to execute the stored program instructions, wherein the program instructions and data comprise:
   at least one multiple spectral band offset table in which the multiple spectral band offset values are stored; and
   at least one common model, wherein the controller is configured to apply the at least one common model to the calibrated multiple spectral band values to convert color differences detected on the substrate to a film thickness (FT) or critical dimension (CD) value.

3. The system of claim 2, wherein the program instructions and data comprise a plurality of common models and a plurality of multiple spectral band offset tables, wherein each common model and each multiple spectral band offset table corresponds to a different material that could be applied to a surface of the substrate.

4. The system of claim 1, wherein prior to monitoring the one or more characteristics of the substrate, either the controller or an additional controller is configured to generate the plurality of multiple spectral band offset values stored within at least one multiple spectral band offset table by:
   obtaining multiple spectral band values from a test wafer run through each of the plurality of WIS modules, wherein the test wafer comprises a predetermined pattern of thickness changes or color changes across the test wafer; and
   comparing the multiple spectral band values obtained from the test wafer to multiple spectral band values obtained from a sample wafer to determine the plurality of multiple spectral band offset values.

5. The system of claim 4, wherein either the controller or an additional controller is configured to comparing the multiple spectral band values obtained from the test wafer to multiple spectral band values obtained from a sample wafer by:
   generating a 3-D scatter plot of the multiple spectral band values obtained from the test wafer and the multiple spectral band values obtained from the sample wafer;
   averaging the multiple spectral band values for the test wafer contained in each color cell of the 3-D scatter plot;
   averaging the multiple spectral band values for the sample wafer contained in each color cell of the 3-D scatter plot; and
   determining a difference or ratio between the average multiple spectral band values for the test wafer and the average multiple spectral band values for the sample wafer in each color cell of the 3-D scatter plot to generate the plurality of multiple spectral band offset values stored within the at least one multiple spectral band offset table.

6. The system of claim 4, wherein the predetermined pattern of thickness changes on the test wafer comprise a predetermined pattern of wedges, radials, steps, concave structures, or convex structures.

7. The system of claim 4, wherein the test wafer comprises a predetermined pattern of color changes, the predetermined pattern of color changes on the test wafer comprise a number of different color samples, which are transferred or printed onto the test wafer.

8. A method to calibrate multiple spectral band values generated by at least one or more wafer inspection system (WIS) modules, the method comprising:
   running a test wafer through at least one or more WIS modules to obtain multiple spectral band values for the test wafer from each of the at least one or more WIS modules, wherein the test wafer comprises a predetermined pattern of thickness changes or color changes across the test wafer, wherein each of the at least one or more WIS modules includes a camera system configured to obtain multiple spectral band values from the test wafer, a sample wafer or a substrate disposed within each of the WIS modules and a controller coupled to receive and calibrate the multiple spectral band values;
   comparing the multiple spectral band values obtained from the test wafer to multiple spectral band values obtained from the sample wafer to determine multiple spectral band offset values; and
   storing the multiple spectral band offset values within each of the WIS modules;
   after the storing, providing the substrate within at least one of the WIS modules to obtain multiple spectral band values for the substrate; and
   applying multiple spectral band offset values to the multiple spectral band values obtained from the substrate to generate calibrated multiple spectral band values, which compensate for spectral responsivity differences between camera systems included within the one or more WIS modules.

9. The method of claim 8, wherein prior to running the test wafer, the method further comprises creating the test wafer having the predetermined pattern of thickness changes or color changes across the test wafer.

10. The method of claim 9, wherein said creating the test wafer comprises:
   providing a coated test wafer on a hot plate having a programmable array of lift devices; and
   creating a wedge air gap between the coated test wafer and the hot plate to produce a temperature difference across the coated test wafer, which induces a predetermined pattern of wedges across the test wafer.

11. The method of claim 9, wherein said creating the test wafer comprises using a multi-coat method combined with variable nozzle position to create a predetermined pattern of radially dependent thickness changes across the test wafer.

12. The method of claim 9, wherein said creating the test wafer comprises using a linear scan low impact puddle method combined with variable develop contact time with a developer or solvent to create a predetermined pattern of wedges on the test wafer.

13. The method of claim 9, wherein said creating the test wafer comprises using a variable edge exposure followed by a Post Exposure Bake (PEB) process and a Develop (DEV) process to create a predetermined pattern of thickness variations on the test wafer.

14. The method of claim 9, wherein said creating the test wafer comprises using a single lamp with linear scan stage exposure system or a multiple lamp exposure system to create a predetermined pattern of thickness variations on the test wafer via crosslinking, oxidation, bond breaking or deprotection.

15. The method of claim 9, wherein said creating the test wafer comprises using a stepper/scanner to expose an open frame dose stepping, resist coating the test wafer, followed by a Post Exposure Bake (PEB) process and a Develop (DEV) process, to create a predetermined pattern of stepped thickness changes on the test wafer.

16. The method of claim 9, wherein said creating the test wafer comprises using a color printer to transfer or print a number of different color samples on the test wafer.

17. The method of claim 9, wherein the test wafer is created on-the-fly, while substrates are undergoing processing.

18. The system of claim 1, wherein the multiple spectral band values are red, green and blue (RGB) values.

19. The method of claim 8, wherein said comparing the multiple spectral band values comprises:
    generating a 3-D scatter plot of the multiple spectral band values obtained from the test wafer and the multiple spectral band values obtained from the sample wafer;
    averaging the multiple spectral band values for the test wafer contained in each color cell of the 3-D scatter plot;
    averaging the multiple spectral band values for the sample wafer contained in each color cell of the 3-D scatter plot; and
    determining a difference or ratio between the average multiple spectral band values for the test wafer and the average multiple spectral band values for the sample wafer in each color cell of the 3-D scatter plot to generate the multiple spectral band offset values.

20. The method of claim 8, further comprising applying a common model to the calibrated multiple spectral band values to convert color differences detected on the substrate to a film thickness (FT) or critical dimension (CD) value.

21. The method of claim 8, wherein the multiple spectral band values are red, green and blue (RGB) values.

22. The method of claim 8, wherein the camera is a visible light camera, a multispectral imaging camera, or a hyperspectral imaging camera.

23. A system, comprising:
    a plurality of wafer inspection system (WIS) modules for monitoring one or more characteristics of a substrate, wherein each WIS module comprises:
        a camera system configured to obtain multiple spectral band values from the substrate when the substrate is disposed within each of the WIS modules; and
        a controller coupled to receive the multiple spectral band values from the camera system, each of the multiple spectral band values being associated with a calculated light intensity across a band of wavelength, wherein the controller is configured to apply multiple spectral band offset values to the multiple spectral band values received from the camera system to generate calibrated multiple spectral band values, which compensate for spectral responsivity differences between the camera systems included within the plurality of WIS modules, wherein prior to monitoring the one or more characteristics of the substrate, either the controller or an additional controller is configured to compare, in each color cell of a scatter plot of the multiple spectral band values obtained from a test wafer and the multiple spectral band values obtained from a sample wafer, an average multiple spectral band values obtained from the test wafer to an average multiple spectral band values obtained from the sample wafer to determine the plurality of multiple spectral band offset values.

* * * * *